(12) United States Patent
Shmarev

(10) Patent No.: US 8,934,084 B2
(45) Date of Patent: Jan. 13, 2015

(54) SYSTEM AND METHOD FOR PRINTING INTERFERENCE PATTERNS HAVING A PITCH IN A LITHOGRAPHY SYSTEM

(75) Inventor: Yevgeniy Konstantinovich Shmarev, Lagrangeville, NY (US)

(73) Assignee: ASML Holding N.V., Veldhoven (NL)

( * ) Notice: Subject to any disclaimer, the term of this patent is extended or adjusted under 35 U.S.C. 154(b) by 1142 days.

(21) Appl. No.: 11/443,431

(22) Filed: May 31, 2006

(65) Prior Publication Data
US 2007/0279642 A1   Dec. 6, 2007

(51) Int. Cl.
G03B 27/52   (2006.01)
G03F 7/20   (2006.01)

(52) U.S. Cl.
CPC .................................. *G03F 7/70408* (2013.01)
USPC ............................................................ 355/55

(58) Field of Classification Search
USPC ................ 355/55, 53, 67; 356/450, 520, 521; 359/577, 583
See application file for complete search history.

(56) References Cited

U.S. PATENT DOCUMENTS

| | | | |
|---|---|---|---|
| 4,560,249 A | 12/1985 | Nishiwaki et al. |
| 4,596,467 A | 6/1986 | Bartelt |
| 4,792,197 A | 12/1988 | Inoue et al. |
| 4,806,454 A | 2/1989 | Yoshida et al. |
| 5,142,385 A | 8/1992 | Anderson et al. |
| 5,229,872 A | 7/1993 | Mumola |
| 5,296,891 A | 3/1994 | Vogt et al. |
| 5,414,835 A | 5/1995 | Iijima |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,640,239 A | 6/1997 | Takamiya et al. |
| 5,677,703 A | 10/1997 | Bhuva et al. |
| 5,705,321 A | 1/1998 | Brueck et al. |

(Continued)

FOREIGN PATENT DOCUMENTS

| EP | 0243520 B1 | 11/1991 |
|---|---|---|
| JP | 61-190368 A | 8/1986 |

(Continued)

OTHER PUBLICATIONS

Translation of JP 7-159609.*

(Continued)

*Primary Examiner* — Chia-how Michael Liu
(74) *Attorney, Agent, or Firm* — Pillsbury Winthrop Shaw Pittman LLP

(57) ABSTRACT

An interferometric lithography system produces a pattern having a sharp field edge and minimal optical path length difference. Light passes through a beamsplitter into an input prism. The two beams produced by the beamsplitter are reflected off respective surfaces of the input prism toward a substrate prism. The substrate prism is symmetric to the input prism such that the incidence angle at an image plane is approximately equal to the beamsplitter diffraction angle. Alternatively, light passes through a beamsplitter into a prism. The two beams produced by the beamsplitter are reflected off respective surfaces of the prism toward an output surface of the prism, such that the incidence angle at the output surface is approximately equal to the beamsplitter diffraction angle. A plurality of these interferometers can be stacked, each being optimized for a given pitch, such that the stack provides a variable pitch interferometry system.

20 Claims, 6 Drawing Sheets

(56) References Cited

U.S. PATENT DOCUMENTS

| | | | |
|---|---|---|---|
| 5,759,744 A | 6/1998 | Brueck et al. | |
| 5,771,098 A | 6/1998 | Ghosh et al. | |
| 5,808,797 A | 9/1998 | Bloom et al. | |
| RE36,113 E | 2/1999 | Brueck et al. | |
| 5,982,553 A | 11/1999 | Bloom et al. | |
| 6,013,396 A | 1/2000 | Capodieci | |
| 6,133,986 A | 10/2000 | Johnson | |
| 6,177,980 B1 | 1/2001 | Johnson | |
| 6,178,000 B1 | 1/2001 | Hoffnagle | |
| 6,185,019 B1 | 2/2001 | Hobbs et al. | |
| 6,233,044 B1 | 5/2001 | Brueck et al. | |
| 6,304,318 B1 | 10/2001 | Matsumoto | |
| 6,556,280 B1 | 4/2003 | Kelsey et al. | |
| 6,687,041 B1 | 2/2004 | Sandstrom | |
| 6,694,075 B1 * | 2/2004 | Bhatia et al. | 385/37 |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,830,850 B1 | 12/2004 | Krivokapic et al. | |
| 6,882,477 B1 | 4/2005 | Schattenburg et al. | |
| 7,492,442 B2 | 2/2009 | Markoya et al. | |
| 2001/0021487 A1 | 9/2001 | Williams et al. | |
| 2001/0035991 A1 | 11/2001 | Hobbs et al. | |
| 2002/0030802 A1 | 3/2002 | Sugita et al. | |
| 2002/0031725 A1 | 3/2002 | Sugita et al. | |
| 2002/0134985 A1 | 9/2002 | Chen et al. | |
| 2002/0149751 A1 | 10/2002 | Bloomstein et al. | |
| 2002/0149757 A1 | 10/2002 | Kelsey et al. | |
| 2002/0149849 A1 | 10/2002 | Kelsey et al. | |
| 2003/0098979 A1 | 5/2003 | Dress et al. | |
| 2003/0147082 A1 | 8/2003 | Goldstein | |
| 2004/0041104 A1 | 3/2004 | Liebregts et al. | |
| 2004/0042724 A1 | 3/2004 | Gombert et al. | |
| 2004/0110092 A1 | 6/2004 | Lin | |
| 2004/0130561 A1 | 7/2004 | Jain | |
| 2005/0007572 A1 | 1/2005 | George et al. | |
| 2005/0012933 A1 | 1/2005 | Matthews | |
| 2005/0057735 A1 | 3/2005 | Smith | |
| 2005/0064297 A1 | 3/2005 | Wago | |
| 2005/0073671 A1 | 4/2005 | Borodovsky | |
| 2005/0074698 A1 | 4/2005 | Borodovsky | |
| 2005/0088633 A1 | 4/2005 | Borodovsky | |
| 2005/0094152 A1 | 5/2005 | Allen | |
| 2005/0105100 A1 | 5/2005 | Swindal | |
| 2005/0168717 A1 | 8/2005 | Hinsberg, III et al. | |
| 2006/0044539 A1 | 3/2006 | Markoya et al. | |
| 2006/0046156 A1 * | 3/2006 | Amako et al. | 430/1 |

FOREIGN PATENT DOCUMENTS

| | | | |
|---|---|---|---|
| JP | 02-067559 A | 3/1990 | |
| JP | 3-263313 A | 11/1991 | |
| JP | 4-163461 A | 6/1992 | |
| JP | 5-072408 A | 3/1993 | |
| JP | 5-217856 A | 8/1993 | |
| JP | 5-226217 | 9/1993 | |
| JP | 6-053122 A | 2/1994 | |
| JP | 06-067007 A | 3/1994 | |
| JP | 6-053122 U | 7/1994 | |
| JP | 7-094393 | 4/1995 | |
| JP | 07-159609 A | 6/1995 | |
| JP | 7159609 * | 6/1995 | G02B 5/18 |
| JP | 8-288211 | 11/1996 | |
| JP | 9-036034 | 2/1997 | |
| JP | 10-115932 | 5/1998 | |
| JP | 10-270330 A | 10/1998 | |
| JP | 2000-021716 A | 1/2000 | |
| JP | 2000-021720 A | 1/2000 | |
| JP | 2000-021763 | 1/2000 | |
| JP | 2000-223400 A | 8/2000 | |
| JP | 2001-007020 A | 1/2001 | |
| JP | 2001-085327 | 3/2001 | |
| JP | 2001-223149 A | 8/2001 | |
| JP | 2002-162750 A | 6/2002 | |
| JP | 2003-224047 A | 8/2003 | |
| JP | 2004-014866 A | 1/2004 | |
| JP | 2004-014867 A | 1/2004 | |
| JP | 2004-317922 A | 11/2004 | |
| JP | 2005-026649 | 1/2005 | |
| JP | 2005-099537 A | 4/2005 | |
| JP | 2005-134873 A | 5/2005 | |
| JP | 2006-066919 | 3/2006 | |
| JP | 2006-091555 A | 4/2006 | |
| JP | 2006-093644 A | 4/2006 | |
| KR | 9401227 B1 | 2/1994 | |
| WO | WO 98/18049 A1 | 4/1998 | |
| WO | WO 98/33096 A1 | 7/1998 | |
| WO | WO 98/38597 A2 | 9/1998 | |
| WO | WO 98/38597 A3 | 9/1998 | |
| WO | WO 2004/003611 A1 | 1/2004 | |
| WO | WO 2004/088363 A1 | 10/2004 | |

OTHER PUBLICATIONS

Translation of JP 2002-162750.*
A. Bourov et al., "Immersion Microlithography at 193 nm with a Talbot Prism Interferometer," *Proc. SPIE* 5377 (2004).
T.M. Bloomstein et al., "22-nm Immersion Interference Lithography," *Optics Express*, vol. 14, No. 14, pp. 6434-6443, Jul. 10, 2006.
Office Action dated Jul. 6, 2010 in corresponding Japanese patent application No. 2007-137326.
Japanese Office Action mailed Aug. 20, 2013 in corresponding Japanese Patent Application No. 2010-226475.
Japanese Office Action mailed Nov. 22, 2012 in corresponding Japanese Patent Application No. 2010-226474.
Japanese Office Action mailed Nov. 26, 2012 in corresponding Japanese Patent Application No. 2010-226475.

* cited by examiner

SYSTEM AND METHOD FOR PRINTING INTERFERENCE PATTERNS HAVING A PITCH IN A LITHOGRAPHY SYSTEM

BACKGROUND OF THE INVENTION

1. Field of the Invention

The present invention relates to lithographic systems, and more particularly to interferometric lithography.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which is commonly referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., photoresist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Resolution achieved by the overall semiconductor manufacturing process depends not only on the optics involved, but also on the chemical processes employed (e.g., interactions between the photoresist and the etching chemicals, etc.).

It is very difficult to use conventional masks, reticles, and patterning arrays to achieve resolutions at the nanometer scale, such as 30-100 nm.

Interferometric lithography tools have been proposed, either within an immersion system or by themselves, to form small nanometer scale features. Interference lithography is particularly useful for fabricating periodic patterns. Interference lithography is a process where two coherent beams interfere to produce a standing wave, which can be recorded in, for example, a photoresist on a wafer.

Hybrid optical interference lithography is an imaging technique whereby a minimum pitch grid of features is printed using interference lithography. These features are then "trimmed" in a second lithography step (e.g., optical, maskless, or electron beam) to form useful circuitry.

These methods typically use a Talbot interferometer scheme. In order to achieve higher resolutions, non-symmetrical Talbot interferometer schemes have been suggested. However, it is sometimes very difficult to achieve a desirable fringe contrast across a large image field when using these systems. Additionally, there is a need for reliable techniques for printing fringes on the wafer under constraints such as limited laser coherence, the need to have sharp field edge, and/or the need to vary the pitch of the printed pattern.

Therefore, what is needed is an interferometric lithography system and method that generates a desired contrast across an entire field of a pattern having a pitch at resolution dimensions matching or surpassing current conventional, lens based lithography system capabilities.

BRIEF SUMMARY OF THE INVENTION

In one embodiment of the present invention, light from an illumination source passes through a beam splitting device, such as a diffraction grating, into an input prism. The beam splitting device is integrally formed into the prism, is coupled to the prism through optical contact, or is coupled to the prism through an immersion liquid. The light from the beam splitting device is split into two beams. Each beam is reflected off a surface of the input prism at a given reflectance angle, and is directed toward a substrate prism through an afocal imaging branch. The afocal imaging branch produces unit magnification, creates a sharp image of the field blades, and reduces shear in the beam. The substrate prism is symmetric to the input prism. Each beam is reflected off a surface of the substrate prism at the given reflectance angle, and is directed toward an output surface. The output surface defines the image plane of the interferometer. Due to the symmetry of the interferometer, the two beams are incident on the output surface of the substrate prism at an angle that is approximately equal to the diffraction angle of the beam splitting device. The two beams interfere at the output surface to produce an image to be printed on a substrate.

In another embodiment of the present invention, light passes through a beam splitting device, such as a diffraction grating, into a monolithic prism. The beam splitting device is proximate to the prism in a similar manner as described above. The light is split into two beams. Each beam is reflected off a surface of the monolithic prism at a given reflectance angle. The reflected beams are then incident on an output surface of the monolithic prism. The output surface of the monolithic prism defines an image plane for the interferometer. The angle of incidence of the beams on the output surface is approximately equal to the angle of diffraction of the beam splitting device. The two beams interfere at the output surface of the monolithic prism to produce an image to be printed on a substrate.

Elements of each of the above systems, such as the angles of reflectance and the distance between the diffraction grating and the image plane, can be altered so as to optimize an interferometer for a given pitch. To provide an interferometric lithography system having variable pitch, a plurality of these interferometers are arranged in, for example, a stack formation. Each interferometer in the stack of interferometers is optimized for a given pitch. The stack of interferometers can then be moved as necessary, so that light from an illumination system is directed through the interferometer optimized for a required pitch.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit (s) in the corresponding reference number.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of one skilled in the art to effect such feature, structure, or characteristic in connection with other embodiments whether or not explicitly described.

I. Exemplary Interferometric Lithography Systems

Figure 1:
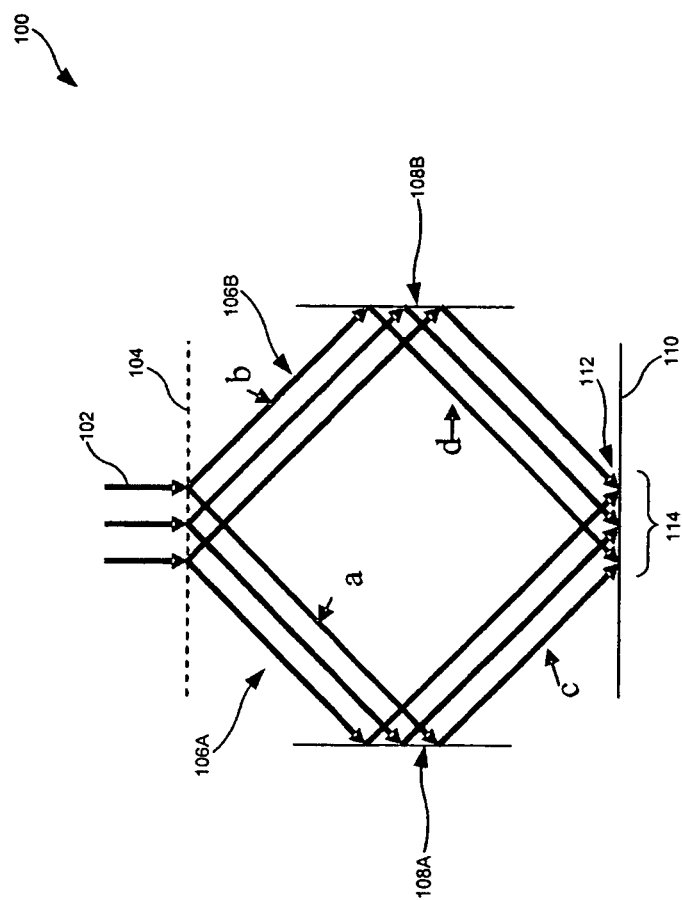
FIGS. 1 and 2 illustrate exemplary Talbot interferometric patterning systems.

FIG. 1 illustrates an interferometric lithographic system 100, commonly known in the art as a Talbot interferometer. A spatially and temporally coherent light beam 102, normally generated by a laser (not shown), is incident on a beam splitter 104 (e.g., a diffractive device, a diffraction grating, a phase shifting beam splitter, or the like). Beam splitter 104 separates beam 102 into first and second beams 106A and 106B. The two beams 106A and 106B are then redirected by first and second reflecting surfaces 108A and 108B, respectively, towards a substrate 110 (e.g., a workpiece, a display, or the like, hereinafter referred to as a substrate). Each path from beam splitter 104 to substrate 110 is sometimes referred as an "arm" or "branch" of interferometer 100. Exemplary conventional Talbot interferometers include U.S. Pat. Nos. 7,005,235, 6,882,477 and 4,596,467 and U.S. Published Patent Application No. 2005-0073671, which are all incorporated by reference herein in their entireties.

An interference pattern 112 is formed at a top surface of substrate 110. Interference pattern 112 exposes a photoresist layer (not labeled in FIG. 1) with a writing image. For example, first and second beams 106A and 106B can be projected onto substrate 110 to interfere to expose a plurality of lines on substrate 110. These lines correspond to lines of maxima caused by constructive interference between the beams of radiation, separated by minima caused by destructive interference between the two beams of radiation.

It is to be appreciated that substrate 110 can be located on a stage or table (not shown) that allows for movement of the substrate 110 with respect to the writing image, e.g., scanning, stepping, or the like, to allow for patterning of an entire surface of the substrate 110. In another example, substrate 110 can be stationary during imaging of the whole substrate 110.

In one example, beam splitter 104 produces only first order beams as beams 106A and 106B. In various examples, beam splitter 104 can be a phase shifting, alternating phase shifting, binary phase shifting, or another type of beam splitter, as would apparent to a skilled artisan upon reading this description.

In one example, beam 106A has a path length a between beam splitter 104 and reflecting surface 108A, while beam 106B has a path length b between beam splitter 104 and reflecting surface 108B. Similarly, beam 106A has a path length c between reflecting surface 108A and substrate 110, while beam 106B has a path length d between reflecting surface 108B and substrate 110. In the example shown, Talbot interferometer 100 is generally referred to as a symmetrical system because a+c=b+d, which produces substantially uniform fringes 112 across an exposure field 114, which is desirable.

In one example, coherent radiation 102 is produced by an illuminator (not shown) that receives a radiation beam from a radiation source (not shown). In one example, the radiation source can provide radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by the radiation source has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365 nm, 405 nm, and 436 nm. A 355 nm laser source can be used.

The source and the lithographic apparatus can be separate units or subsystems, for example when the source is an excimer laser. In such cases, the source is not considered to form part of the lithographic apparatus and the radiation beam is passed from the source to an illuminator with the aid of a beam delivery system comprising, for example, suitable directing mirrors and/or a beam expander.

Figure 2:
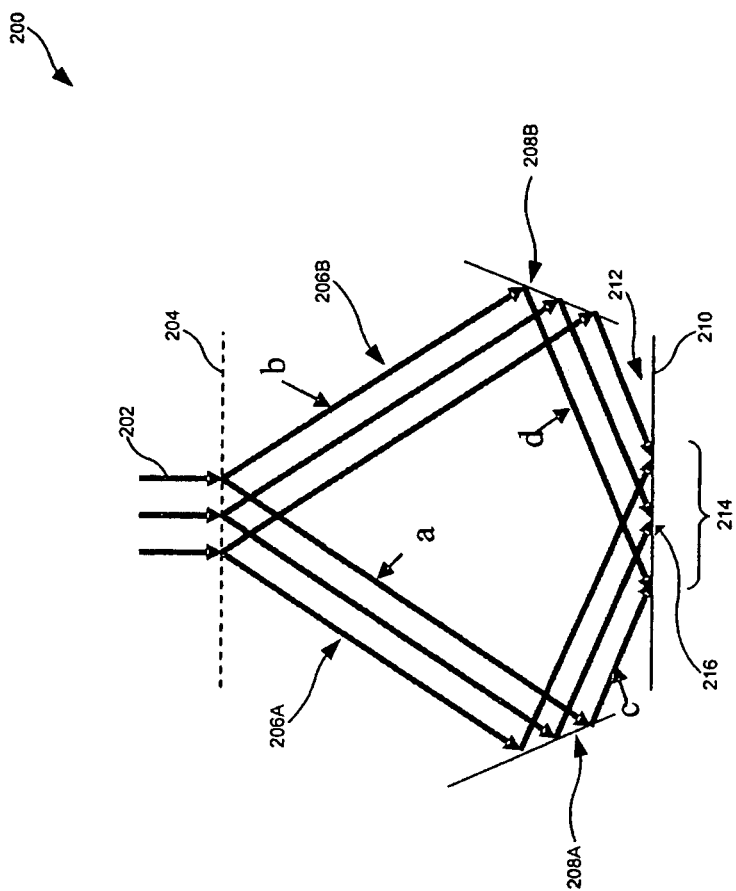

FIG. 2 illustrates another interferometric lithographic system 200. A spatially and temporally coherent light beam 202 is incident on a beam splitter 204. In one example, beam 202 can be formed from a similar illumination and/or radiation system as described above for beam 102. Beam splitter 204 separates the beam 202 into first and second beams 206A and 206B. In one example, beam splitter 204 produces only first diffraction order beams as beams 206A and 206B. The two beams 206A and 206B are then redirected by first and second reflecting surfaces 208A and 208B, respectively, towards a substrate 210. An interference pattern 212 is formed at a top surface of substrate 210. The interference pattern 212 exposes, for example, a photoresist layer (not labeled in FIG. 2) across exposure field 214. Beams 206A and 206B and substrate 210 can be moved with respect to each other, as described above, or remain stationary. System 200 may be contained in, for example, an immersion liquid.

Reflecting surfaces 208A and 208B in FIG. 2 are oriented in positions that allow for a larger angle of incidence on substrate 210, as compared to the orientation of reflecting surfaces 108A and 108B in FIG. 1. The larger angle of incidence allows for an increased resolution in patterns formed on substrate 210 by fringes 212 as compared to patterns formed on substrate 110 by fringes 112. The period of grating in the beam splitter 204 is significantly larger than the period of the interference pattern created on substrate 210 by fringes 212.

In one example, beam 206A has a path length a between beam splitter 204 and reflecting surface 208A, while beam 206B has a path length b between beam splitter 204 and reflecting surface 208B. Similarly, beam 206A has a path length c between reflecting surface 208A and substrate 210, while beam 206B has a path length d between reflecting surface 208B and substrate 210. In the example shown, the interferometer 200 may be referred to as a non-symmetrical system because a+c≠b+d outside the center of the field, which can produce substantially non-uniform fringe pattern 212 across an exposure field 214, which is undesirable. For example, although fringes are well formed and high contrast at a center position 216, moving away from the center position 216 in either direction causes a differential in beam path length and an image contrast value due to loss of temporal coherence in the beams. Beams 206A and 206B do not properly interfere across their entire width, only at the center 216 of the exposure field 214. Thus, at high resolutions, image fringes 212 across field 214 producing the image may not be of consistent contrast. That is, there is a maximum contrast ratio at the center 216 of the exposure field 214. Therefore, only part of fringes 212 may produce an optimum image.

Since the interferometer 200 is a non-symmetrical system, coherency matching over the full width of the exposure field 214 may not be optimal. There are two types of coherence that are typically of concern for this type of imaging: (1) spatial coherence (i.e., space/position based) and (2) temporal coherence (i.e., time based), which are discussed in more detail below. In general, the concept of coherence is related to the stability, or predictability of phase. Rays at a given substrate position emanate from the same position on the beam splitter 204.

Spatial coherence describes the correlation between light beams at different points in space. Spatial coherence is described as a function of distance, i.e., spatial coherence is the maintenance of a fixed-phase relationship across the full diameter of a cross section of a beam.

Temporal coherence describes the correlation or predictable relationship between light beams observed at different moments in time. In optics, temporal coherence is measured by combining beams from the same source, but having a known path length difference, and observing the interference pattern produced. In one example, a temporal coherence length is calculated by dividing a wavelength squared by the bandwidth of the beam.

In one example, coherency matching (temporal coherence) can become mismatched because the beam angles at the beam splitter 204 are not the same as at the angles at the substrate 210, which results in the non-symmetrical path lengths (e.g., a+c≠b+d). For example, the angles are the same for the Talbot interferometer 100 based on the fact it has fully symmetric path lengths. This results in the fringes 112 from the two interfering laser beams 106A and 106B being equal at all points across the exposure field 114. However, the angles are not the same for the Talbot interferometer 200 based on the fact that Talbot interferometer 200 does not have filly symmetric path lengths for the two interfering beams 206A and 206B. This can result in fringe contrasts differing by an increasing amount as the beams 206A and 206B are displaced from center 216 of field 214. In one example, cases of very high resolution imaging may only be able to utilize the central band in the middle 216 of the field 214 for imaging, which decreases the size of an allowable portion of field 214 for imaging, decreasing throughput.

Figure 3:
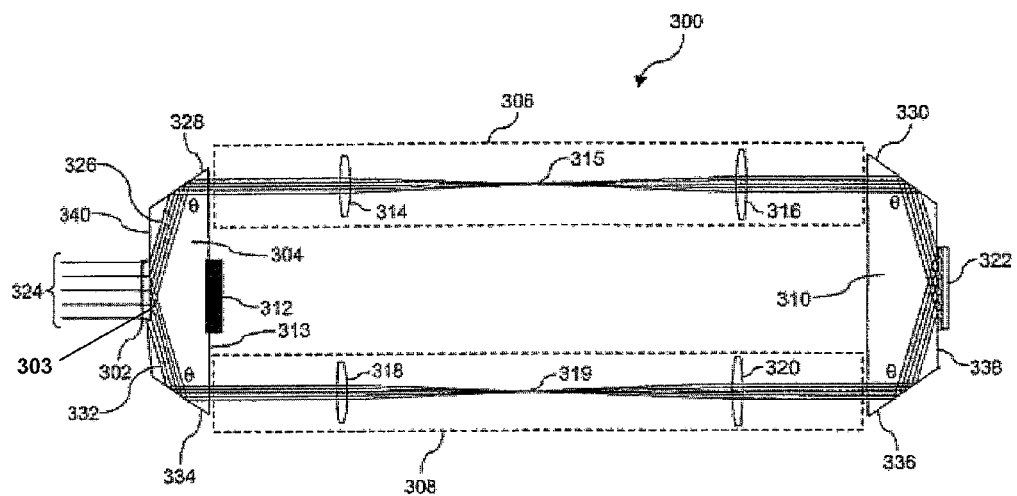
FIG. 3 illustrates a two-prism interferometric system according to an embodiment of the present invention.

II. Exemplary Interferometric Lithography Systems for Printing Patterns Having a Pitch FIG. 3 illustrates an interferometer 300 that provides fully symmetric path lengths while allowing for a larger angle of incidence on the substrate. Interferometer 300 includes an input diffraction grating 302, an input prism 304, a first afocal imaging branch 306, a second afocal imaging branch 308, and a substrate prism 310. Although reference is made herein to an input diffraction grating, one of skill in the pertinent art(s) will recognize that any type of beam splitting device may be used, such as, for example and without limitation, a phase shifting beam splitter or other diffractive device.

Input diffraction grating 302 has a period approximately equal to twice the period of the interference pattern to be formed at an image plane 338. Input diffraction grating 302 is proximate to an input surface 340 of prism 304. In one embodiment of the present invention, input diffraction grating 302 is fabricated or integrally formed on an input surface 340 of input prism 304. In another embodiment of the present invention, input diffraction grating 302 is in optical contact with input surface 340. In yet another embodiment of the present invention, any gap between input diffraction grating 302 and input surface 340 is filled with an immersion liquid.

A zero diffraction order light blocker, e.g., blocking aperture 312, is located between input prism 304 and substrate prism 310, across from input diffraction grating 302. Blocking aperture 312 is also located between first afocal imaging branch 306 and second afocal imaging branch 308. Blocking aperture 312 blocks zero order diffraction light from reaching image plane 338 after exiting input diffraction grating 302, and may be, for example and without limitation, an opaque plate. Field blades 303 can be included with grating 302, and/or can be placed on an output surface 313 of input prism 304. A border of the field blades may be used to create the border of the interference pattern formed at image plane 338. This border may be, for example, rectangular.

First afocal imaging branch 306 includes lenses 314 and 316, arranged symmetrically about a midpoint of first afocal imaging branch 306. Second afocal imaging branch 308 includes lenses 318 and 320, identical to lenses 314 and 316, respectively, arranged symmetrically about a midpoint of second afocal imaging branch 308. Lenses 314 and 316 and lenses 318 and 320 provide light in respective branches 306 and 308 with unit magnification. These lenses also form sharp images on image plane 338 of any field blades coupled to input diffraction grating 302.

An input light beam 324 is directed onto input diffraction grating 302 having a given diffraction angle. Input diffraction grating 302 splits input light beam 324 into two separate and spatially coherent radiation beams, first beam 326 and second beam 332. First beam 326 reflects off a first surface 328 of prism 304 at a reflectance angle θ, and passes through first afocal imaging branch 306. In first afocal imaging branch 306, lens 314 causes first beam 326 to converge at convergence point 315. Convergence point 315 can be located, for example, at the midpoint of first afocal imaging branch 306. Lens 316 then directs first beam 326 toward substrate prism 310. Lenses 314 and 316 within interferometer 300 reduce shear effects within first beam 326.

Substrate prism 310 faces input prism 304. The angles of the surfaces of substrate prism 310 are symmetrical to the angles of the surfaces of input prism 314, such that interferometer 300 includes four symmetrical reflecting surfaces.

After passing through first afocal imaging branch 306, first beam 326 reflects off a first surface 330 of substrate prism 310 at reflectance angle θ toward image plane 338.

After exiting input diffraction grating 302, second beam 332 reflects off a second surface 334 of prism 304 at reflectance angle θ and passes through second afocal imaging branch 308. In second afocal imaging branch 308, lens 318 causes second beam 332 to converge at convergence point 319. Lens 320 then directs second beam 332 toward substrate prism 310. Lenses 318 and 320 within interferometer 300 reduce shear effects within second beam 332.

After passing through second afocal imaging branch 308, second beam 332 reflects off a second surface 336 of substrate prism 310 at reflectance angle θ toward image plane 338.

Substrate prism 310 acts as a beam combiner, causing first and second beams 326 and 332 to interfere at image plane 338. This produces an interference pattern at image plane 338, which is coincident with an output surface of substrate prism 310. The interference pattern produced by first and second beams 326 and 332 at image plane 338 is used to produce an image on a substrate 322. Substrate 322 can be positioned at image plane 338, or the pattern may be directed to substrate 322 through a volume of immersion liquid, for example.

The index of refraction of input prism 304 is approximately equal to the index of refraction of substrate prism 310. Input prism 304 and substrate prism 310 may be fabricated from, for example and without limitation, fused silica, which has an index of refraction of 1.56. Because the indices of refraction are matched and light is reflected at the same angle of reflection θ in both prisms, the angle of incidence of beams 326 and 332 on image plane 338 is approximately equal to the diffraction angle of diffraction grating 302. When the magnification of afocal imaging branches 306 and 308 of interferometer 300 is approximately equal to one, image plane 338 functions as if conjugate to input diffraction grating 302. This conjugation of image plane 338 with input diffraction grating 302 allows interferometer 300 to work with minimal spatial coherence. That is, there is minimal shear between the interfering beams. Additionally, there is a low sensitivity to laser pointing instability.

Figure 4:
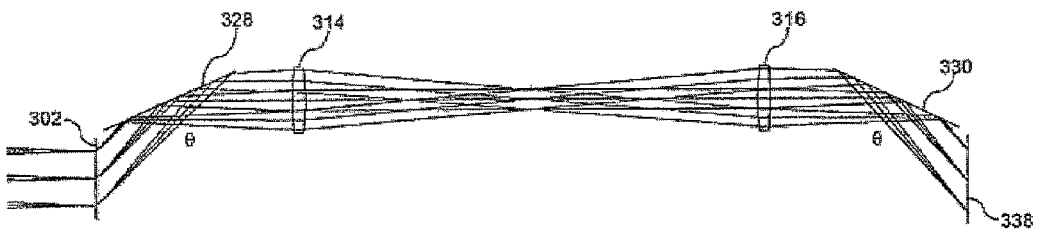
FIG. 4 is a ray trace diagram of the interferometric system of FIG. 3.

FIG. 4 is a ray trace diagram of interferometer 300, with only first afocal imaging branch 306 being shown. In the embodiment of FIG. 4, interferometer 300 has approximately unit magnification, effectuated by lenses 314 and 316. If interferometer 300 has a different magnification, the image planes for first afocal imaging branch 306 and second afocal imaging branch 308 may have opposite tilt and may not coincide.

Figure 5:
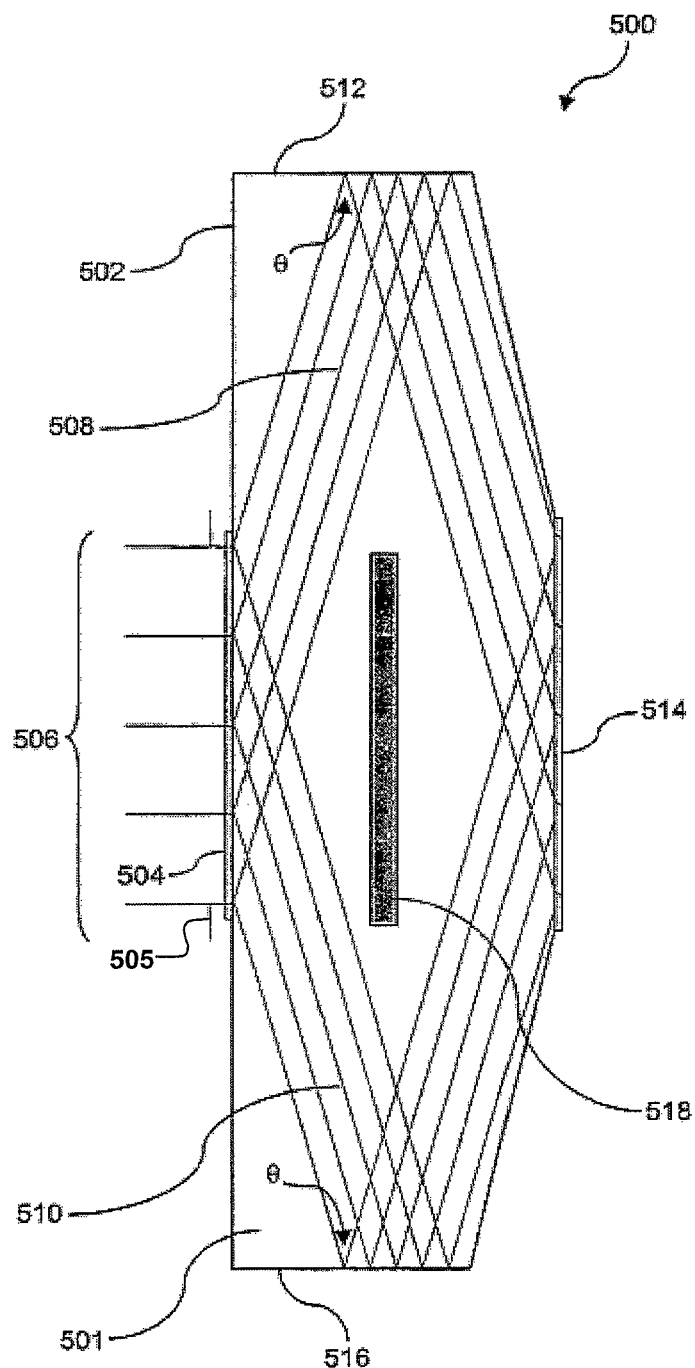
FIG. 5 illustrates a monolithic interferometric system according to an embodiment of the present invention.

Because there is approximately zero optical path length difference between first light path 326 and second light path 332 in interferometer 300, interferometer 300 produces an image having a sharp field edge at image plane 338. When creation of a sharp field edge is not necessary, or if a sharp field edge is provided by other means, a simpler version of interferometer 300 can be used. FIG. 5 illustrates an exemplary interferometer 500, which is a simpler version of interferometer 300. Interferometer 500 includes a prism 501 fabricated from, for example and without limitation, fused silica. Since interferometer 500 requires only a single prism, interferometers similar to interferometer 500 will be referred to herein as monolithic interferometers. Monolithic interferometer 500 has an input surface 502. A field-bladed diffraction grating 504 with field blade 505 is proximate to input surface 502 through, for example and without limitation, optical contact, integral formation, or a volume of an immersion liquid. As with interferometer 300, diffraction grating 504 can alternatively be any type of beam splitting device known to one of skill in the pertinent art(s).

Diffraction grating 504 has a given diffraction angle, and splits input light 506 into a first beam 508 and a second beam 510. First beam 508 reflects off a first surface 512 toward an image plane 514 at reflectance angle θ. Second beam 510 reflects off a second surface 516 toward image plane 514 at reflectance angle θ. First and second surfaces 512 and 516 can be coated with a reflective coating. First and second beams 508 and 510 interfere at image plane 514, where the monolithic prism acts as a beam combiner. This produces an interference pattern at image plane 514, which is coincident with an output surface of the monolithic prism. Field blades on diffraction grating 504 may define, for example, a rectangular border of the interference pattern formed at image plane 514. The incidence angle of first and second beams 508 and 510 on the output surface is approximately equal to the diffraction angle of diffraction grating 504. A substrate can be positioned at image plane 514, or light can be directed to a substrate from image plane 514 through an immersion liquid.

A blocking aperture 518 is imbedded or otherwise positioned in monolithic interferometer 500. Blocking aperture 518 is sized and positioned within monolithic interferometer 500 so as to block zero diffraction order light from reaching image plane 514 after exiting diffraction grating 504.

Although the field edge produced at the image plane by monolithic interferometer 500 may not be as sharp as that produced by interferometer 300, monolithic interferometer 500 still compensates for optical path differences between the interferometer branches. Additionally, sensitivity to spatial coherence is reduced by minimization of the distance between the input diffraction grating and the image plane.

Figure 6:
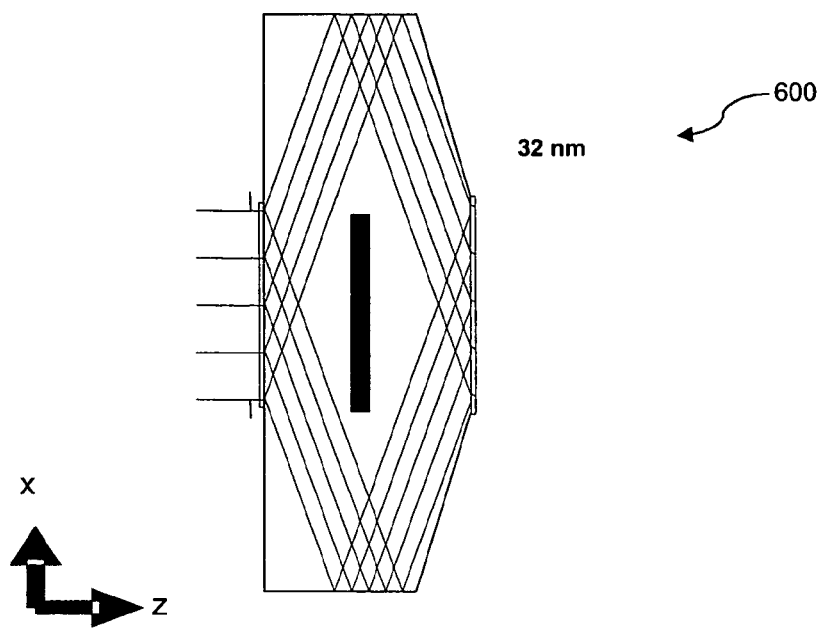
FIG. 6 illustrates an example monolithic interferometric system optimized for a pitch of 32 nm.
Figure 7:
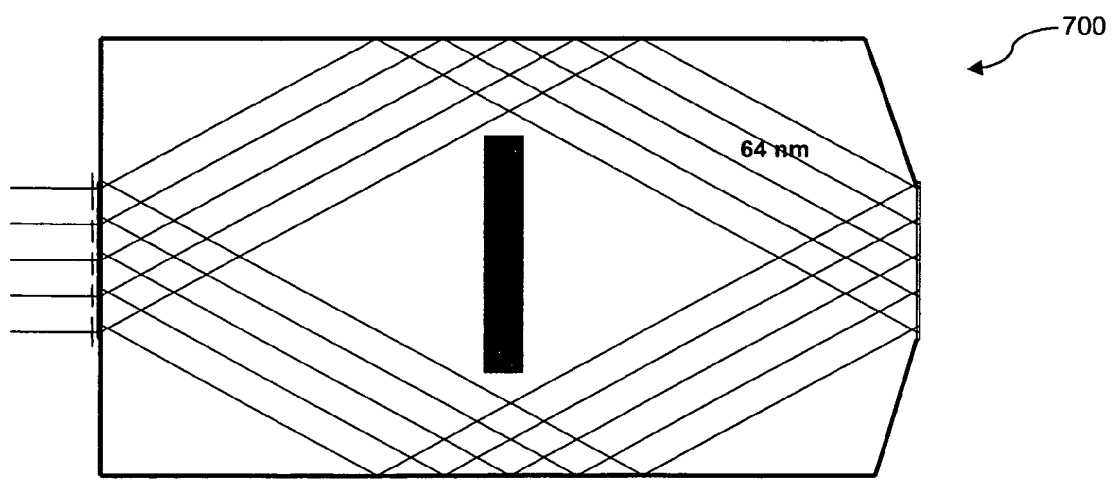
FIG. 7 illustrates an example monolithic interferometric system optimized for a pitch of 64 nm.

Monolithic interferometer 500 can be modified for different pattern pitches, wherein the pitch is the distance between each pattern. FIG. 6 illustrates an example monolithic interferometer 600 that has been optimized for a pattern pitch of 32 nm. FIG. 7 illustrates an example monolithic interferometer 700 that has been optimized for a pattern pitch of 64 nm.

III. Exemplary Variable Pitch Interferometric Lithography System

Variation of pitch in an interferometric lithography system is useful but difficult to implement. This is because design parameters that satisfy angular conditions must be altered while keeping the optical path length difference between the interferometer branches approximately equal to zero. To solve this problem, an array of discrete pitch values can be determined. An interferometric lithography system can then be built as a pile or stack of individual interferometers. Each interferometer in the stack of individual interferometers may be similar to, for example, interferometer 300 and/or monolithic interferometer 500.

Figure 8:
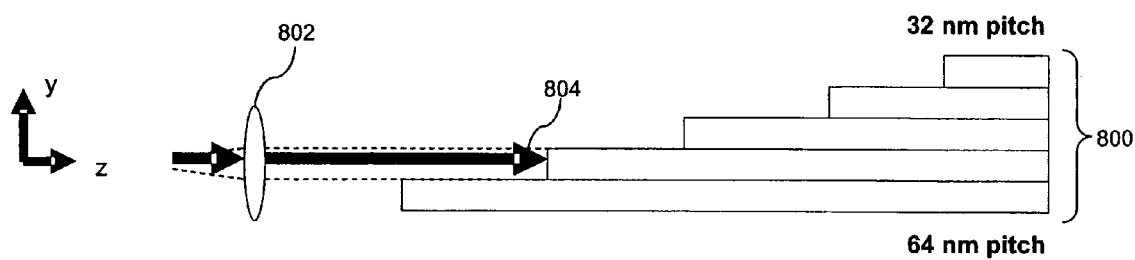
FIG. 8 illustrates a variable pitch interferometric lithography system according to an embodiment of the present invention.

FIG. 8 is an illustration of an exemplary stack of interferometers 800. Stack of interferometers 800 includes five interferometers ranging in pitch from 32 nm to 64 nm, in this example. One of skill in the art will recognize that any number of interferometers having any desired pitch size in any pitch range may be used in a stack formation similar to stack of interferometers 800. Each interferometer in stack of interferometers 800 is in a different plane from other interferometers, and is optimized (e.g., using the input grating, reflection angle, and position) for a specific pitch. The stack of interferometers 800 can then be moved in the Y direction as necessary, relative to an illumination system 802, so that illumination light 804 is incident on the interferometer in the stack of interferometers 800 that is optimized to the required pitch.

Figure 9:
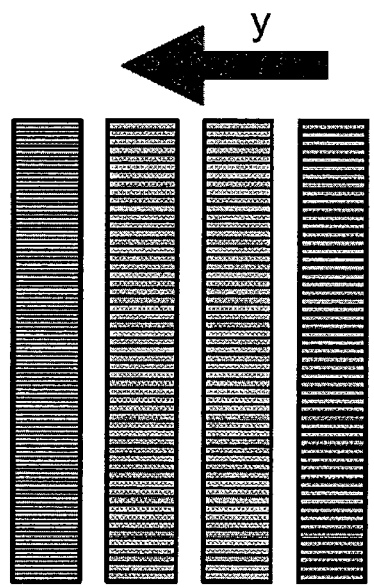
FIG. 9 illustrates the example system of FIG. 8 from the perspective of an illumination system in a lithographic apparatus.

FIG. 9 is an illustration of the stack of interferometers 800 from the perspective of illumination system 802. Input gratings coupled to the various interferometers are aligned such that the grating (and its corresponding interferometer) moves relative to the illumination light when a switch to a new pitch is required.

IV. Conclusion

The above description refers to light, light sources and beams of light. It will be appreciated that the light referred to is not limited to light having a particular wavelength, and can include other wavelengths including (extreme) ultraviolet light or infrared light which are suitable for lithography, as discussed above.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example immersion lithography. The lithographic apparatus can also be of a type wherein at least a portion of the substrate can be covered by an "immersion liquid" having a relatively high refractive index, e.g., water, so as to fill a space between the interferometer and the substrate. An immersion liquid can also be applied to other spaces in the lithographic apparatus, for example, between the patterning device and the interferometer. Immersion techniques are well known in the art for increasing the numerical aperture of projection systems. The term "immersion" as used herein does not mean that a structure, such as a substrate, must be submerged in liquid, but rather only means that liquid is located between the interferometer and the substrate during exposure.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

What is claimed is:

1. An interferometric lithography apparatus, comprising along an optical path:
    a beam splitter to create at least two spatially coherent radiation beams;
    a beam combiner adapted to redirect and combine the at least two spatially coherent radiation beams onto a surface of a substrate to form an interference pattern;
    a field blade, at an object plane, that is separate from the beam splitter and located on, or downstream from, the beam splitter; and
    a lens to image a border of the field blade onto the surface of the substrate so as to create the border of the interference pattern.

2. The interferometric lithography apparatus of claim 1, wherein the beam splitter is provided with a grating and the apparatus further comprises:
    a zero diffraction order radiation blocker between the beam splitter and the beam combiner to block the zero order diffracted radiation of the grating.

3. The interferometric lithography apparatus of claim 2, wherein the apparatus comprises:
    a first and a second afocal imaging branch provided with the lens, the first afocal imaging branch located on an opposite side of the radiation blocker to the second afocal imaging branch and the first and second afocal imaging branches located between the beam splitter and the beam combiner.

4. The interferometric lithography apparatus of claim 3, wherein the first and second afocal imaging branches reduce shear in radiation passing through the first and second afocal imaging branches.

5. The interferometric lithography apparatus of claim 3, further comprising:
    lenses placed symmetrically around a convergence point in the first and second afocal imaging branches to reduce shear in radiation passing through the first and second afocal imaging branches.

6. The interferometric lithography apparatus of claim 2, wherein a pitch of the grating is approximately equal to twice a pitch of a pattern to be patterned onto the surface of the substrate.

7. The interferometric lithography apparatus of claim 1, wherein the beam combiner comprises a reflecting surface.

8. The interferometric lithography apparatus, of claim 1, wherein the beam splitter is provided with the field blade.

9. The interferometric lithography apparatus of claim 1, wherein the field blade defines a rectangular border onto the surface of the substrate.

10. The interferometric lithography apparatus of claim 1, wherein an immersion liquid fills a gap between the beam combiner and the surface of the substrate.

11. An interferometric lithography apparatus, comprising:
    a beam splitter to create at least two spatially coherent radiation beams at a first plane;
    a beam combiner adapted to redirect and combine the at least two spatially coherent radiation beams onto a surface of a substrate to form an interference pattern at a second plane;
    a first afocal imaging branch provided with a lens, the first afocal imaging branch having substantially unit magnification;

a second afocal imaging branch provided with a lens, the second afocal imaging branch having substantially unit magnification; and four reflecting surfaces between the beam splitter and an output surface of the beam combiner which faces the surface of the substrate, wherein, during use, each of the at least two spatially coherent radiation beams are reflected from two of the four reflecting surfaces in series and each of the at least two spatially coherent radiation beams are reflected and converged by two of the four reflecting surfaces in parallel and the first and second planes are substantially optically conjugate.

12. The interferometric lithography apparatus of claim 11, wherein the beam splitter comprises a grating and a blocking aperture to block zero diffraction order radiation of the grating.

13. The interferometric lithography apparatus of claim 12, wherein a pitch of the grating is approximately equal to twice a pitch of an interference pattern to be patterned at the surface of the substrate.

14. The interferometric lithography apparatus of claim 13, further comprising a plurality of lenses and wherein, in use, radiation passes through the lenses and the beam combiner to the surface of the substrate.

15. The interferometric lithography apparatus of claim 14, further comprising a field blade, and wherein the lenses are configured to image a. border of the field blade onto the surface of the substrate to create a border for the interference pattern to be patterned.

16. An interferometric lithography apparatus having variable pitch, comprising:

an illumination system;

a first interferometer to form an interference pattern having a first pitch; and a second interferometer to form an interference pattern having a second pitch, the second interferometer comprising:

a beam splitter to create at least two spatially coherent radiation beams at a first plane;

a beam combiner adapted to redirect and combine the at least two spatially coherent radiation beams onto a surface of a substrate to form the interference pattern at a second plane;

a first afocal imaging branch provided with a lens, the first afocal imaging branch having substantially unit magnification;

a second afocal imaging branch provided with a lens, the second afocal imaging branch having substantially unit magnification; and four reflecting surfaces between the beam splitter and an output surface of the beam combiner which faces the surface of the substrate, wherein, during use, each of the at least two spatially coherent radiation beams are reflected from two of the four reflecting surfaces in series and each of the at least two spatially coherent radiation beams are reflected and converged by two of the four reflecting surfaces in parallel and the first and second planes are substantially optically conjugate, wherein the first and second interferometers are movable with respect to the illumination system such that radiation from the illumination system is incident on one of the first and second interferometers.

17. The interferometric lithography apparatus of claim 16, wherein the first interferometer comprises:

a second beam splitter to create at least two spatially coherent radiation beams; and a second beam combiner adapted to redirect and combine the two spatially coherent radiation beams onto a surface of the substrate to form an interference pattern having the first pitch.

18. The interferometric lithography apparatus of claim 17, wherein the second beam splitter comprises a grating to create the at least two spatially coherent radiation beams.

19. The interferometric lithography apparatus of claim 17, wherein the second beam combiner comprises a reflecting surface.

20. The interferometric lithography apparatus of claim 16, wherein the first and second interferometers are arranged in a stack formation.

* * * * *